(12) United States Patent
Cao

(10) Patent No.: US 9,824,658 B2
(45) Date of Patent: Nov. 21, 2017

(54) GOA CIRCUIT AND LIQUID CRYSTAL DISPLAY DEVICE

(71) Applicant: Shenzhen China Star Optoelectronics Technology Co., Ltd., Shenzhen, Guangdong (CN)

(72) Inventor: Shangcao Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 218 days.

(21) Appl. No.: 14/893,525

(22) PCT Filed: Oct. 26, 2015

(86) PCT No.: PCT/CN2015/092809
§ 371 (c)(1),
(2) Date: Nov. 23, 2015

(87) PCT Pub. No.: WO2017/049704
PCT Pub. Date: Mar. 30, 2017

(65) Prior Publication Data
US 2017/0084238 A1 Mar. 23, 2017

(30) Foreign Application Priority Data
Sep. 22, 2015 (CN) .......................... 2015 1 0609541

(51) Int. Cl.
G09G 3/36 (2006.01)
G11C 19/00 (2006.01)
(Continued)

(52) U.S. Cl.
CPC ......... *G09G 3/3677* (2013.01); *G09G 3/3266* (2013.01); *G09G 3/3674* (2013.01);
(Continued)

(58) Field of Classification Search
CPC .. G09G 3/3266; G09G 3/3674; G09G 3/3677; G09G 2300/0408;
(Continued)

(56) References Cited

U.S. PATENT DOCUMENTS

2002/0167026 A1* 11/2002 Azami .............. H01L 29/42384
257/200
2002/0190326 A1* 12/2002 Nagao .................... H01L 23/62
257/356
(Continued)

*Primary Examiner* — Michael J Eurice
(74) *Attorney, Agent, or Firm* — Andrew C. Cheng

(57) ABSTRACT

A GOA circuit and an LCD device. The GOA circuit includes multiple cascaded GOA units, and each includes a transferring circuit, a latch circuit and an output circuit. In a forward scanning, the transferring circuit receives a (N−1)th stage-transfer signal of a (N−1)th stage, and sending to the latch circuit. In a backward scanning, the transferring circuit receives a (N+1)th stage-transfer signal of a (N+1)th stage, and sending to the latch circuit. In the canning period, the latch circuit receives a first clock signal and a second clock signal simultaneously, and outputs an Nth stage-transfer signal the same as the first clock signal and opposite to the second clock signal. The output circuit receives the Nth stage-transfer signal, and outputs an Nth scanning signal the same as the Nth stage-transfer signal. The present invention utilizes two clock signals to commonly drive the GOA circuit to improve the stability.

19 Claims, 4 Drawing Sheets

(51) Int. Cl.
*G09G 3/3266* (2016.01)
*G11C 19/28* (2006.01)

(52) U.S. Cl.
CPC .............. *G09G 2300/0408* (2013.01); *G09G 2300/0426* (2013.01); *G09G 2310/0283* (2013.01); *G09G 2310/0286* (2013.01); *G09G 2310/0291* (2013.01); *G09G 2310/061* (2013.01); *G09G 2310/063* (2013.01); *G09G 2310/08* (2013.01); *G09G 2330/021* (2013.01); *G09G 2330/04* (2013.01); *G11C 19/28* (2013.01)

(58) Field of Classification Search
CPC ... G09G 2300/0426; G09G 2310/0286; G09G 2310/0283; G09G 2310/0291; G09G 2310/061; G09G 2310/063; G09G 2310/08; G09G 2330/021; G09G 2330/04; G11C 19/28
See application file for complete search history.

(56) References Cited

U.S. PATENT DOCUMENTS

| | | | | |
|---|---|---|---|---|
| 2003/0128180 A1* | 7/2003 | Kim | ............... | G09G 3/3677 345/100 |
| 2003/0189542 A1* | 10/2003 | Lee | ............... | G09G 3/3648 345/93 |
| 2003/0227433 A1* | 12/2003 | Moon | ............... | G09G 3/3677 345/100 |
| 2003/0231735 A1* | 12/2003 | Moon | ............... | G09G 3/3685 377/64 |
| 2003/0234761 A1* | 12/2003 | Washio | ............... | G09G 3/3688 345/100 |
| 2004/0150610 A1* | 8/2004 | Zebedee | ............... | G11C 19/28 345/100 |
| 2004/0189584 A1* | 9/2004 | Moon | ............... | G09G 3/20 345/100 |
| 2006/0022912 A1* | 2/2006 | Park | ............... | G09G 3/3266 345/76 |
| 2006/0202940 A1* | 9/2006 | Azami | ............... | G09G 3/3688 345/100 |
| 2006/0210012 A1* | 9/2006 | Yamaguchi | ............... | G11C 19/28 377/64 |
| 2006/0220587 A1* | 10/2006 | Tobita | ............... | G11C 19/28 315/194 |
| 2007/0127620 A1* | 6/2007 | Moon | ............... | G11C 19/28 377/64 |
| 2008/0101529 A1* | 5/2008 | Tobita | ............... | G09G 3/3677 377/64 |
| 2008/0116944 A1* | 5/2008 | Tobita | ............... | G11C 19/28 327/142 |
| 2008/0158129 A1* | 7/2008 | Murakami | ............... | G09G 3/3688 345/98 |
| 2008/0246716 A1* | 10/2008 | Miyake | ............... | G09G 3/3677 345/92 |
| 2008/0246717 A1* | 10/2008 | Miyake | ............... | G09G 3/3677 345/92 |
| 2009/0027318 A1* | 1/2009 | Murakami | ............... | G09G 3/20 345/87 |
| 2009/0251443 A1* | 10/2009 | Jinta | ............... | G09G 3/3233 345/204 |
| 2010/0238156 A1* | 9/2010 | Iwamoto | ............... | G09G 3/3648 345/213 |
| 2012/0038609 A1* | 2/2012 | Chung | ............... | G09G 3/003 345/211 |
| 2013/0257703 A1* | 10/2013 | Huang | ............... | G11C 19/28 345/100 |
| 2015/0243237 A1* | 8/2015 | Li | ............... | G11C 19/184 345/100 |
| 2016/0189586 A1* | 6/2016 | Zou | ............... | G09G 3/3677 345/213 |
| 2016/0334908 A1* | 11/2016 | Zhuang | ............... | G06F 3/0412 |
| 2016/0351112 A1* | 12/2016 | Qing | ............... | G09G 3/20 |
| 2016/0351156 A1* | 12/2016 | Wu | ............... | G11C 19/28 |
| 2017/0061913 A1* | 3/2017 | Wang | ............... | G09G 3/36 |

\* cited by examiner

GOA CIRCUIT AND LIQUID CRYSTAL DISPLAY DEVICE

BACKGROUND OF THE INVENTION

1. Field of the Invention

The present invention relates to a display technology field, and more particularly to a GOA circuit and a liquid crystal display device.

2. Description of Related Art

An array substrate row driving circuit (GOA, Gate Driver On Array, or Gate On Array) utilizes a conventional TFT-LCD (thin-film-transistor liquid-crystal-display) array manufacturing process to manufacture a gate row scanning and driving circuit on the array substrate in order to achieve scanning and driving gate lines row by row. Comparing with the conventional flexible circuit board (COF) and glass circuit board (COG) technology, the manufacturing cost is saved and a gate electrode bonding process is omitted, which is beneficial for the production capacity and increasing an integration degree of a display device.

A main architecture of a CMOS GOA circuit includes a forward and backward scanning circuit, an output circuit, a signal transferring circuit and a latch circuit. Currently, a narrow frame or a no-frame design is a goal of a display of a cellular phone. A width of the GOA circuit is a main factor that affects a border of the display. Besides, the current GOA CMOS circuit has larger power consumption and is unstable.

SUMMARY OF THE INVENTION

The main technology problem solved by the present invention is to provide a GOA circuit and a liquid crystal display device, which can utilizes two clock signals to common drive the GOA circuit in order to increase the circuit stability.

In order to solve the above technology problem, a technology solution adopted by the present invention is: a gate-on-array (GOA) circuit, comprising: multiple cascaded GOA units, and each GOA unit includes a transferring circuit, a latch circuit and an output circuit connected sequentially; wherein, setting N as a positive integer, and in a Nth stage GOA unit: in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit; in a scanning period, the latch circuit receives a first clock signal and a second clock signal simultaneously, and outputs a Nth stage-transfer signal which is the same as a voltage level of the first clock signal and opposite to a voltage level of the second clock signal; and the output circuit is used for receiving the Nth stage-transfer signal, and outputs a Nth scanning signal which is the same as a voltage level of the Nth stage-transfer signal; wherein, the transferring circuit includes a first transferring gate and a second transferring gate; an input terminal of the first transferring gate is connected to the (N−1)th stage-transfer signal for turning on under the forward scanning, and outputting the (N−1)th stage-transfer signal to the latch circuit; and an input terminal of the second transferring gate is connected to the (N+1)th stage-transfer signal for turning on under the backward scanning, and outputting the (N+1)th stage-transfer signal to the latch circuit; and wherein, the output circuit includes a second NOR gate, a second NOT gate, a third NOT gate and a fourth NOT gate connected sequentially; a first input terminal of the second NOR gate receives the Nth stage-transfer signal outputted from the latch circuit, and a second input terminal of the second NOR gate receives a reset signal; when at least one of the Nth stage-transfer signal and the reset signal is at a high voltage level, the output terminal of the second NOR gate is a low voltage level signal, and after passing through the second NOT gate, the third NOT gate and the fourth NOT gate, outputting the Nth stage scanning signal having a high voltage level.

In order to solve the above technology problem, another technology solution adopted by the present invention is: a gate-on-array (GOA) circuit, comprising: multiple cascaded GOA units, and each GOA unit includes a transferring circuit, a latch circuit and an output circuit connected sequentially; wherein, setting N as a positive integer, and in a Nth stage GOA unit: in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit; in a scanning period, the latch circuit receives a first clock signal and a second clock signal simultaneously, and outputs a Nth stage-transfer signal which is the same as a voltage level of the first clock signal and opposite to a voltage level of the second clock signal; and the output circuit is used for receiving the Nth stage-transfer signal, and outputs a Nth scanning signal which is the same as a voltage level of the Nth stage-transfer signal.

Wherein, the latch circuit includes a first NOR gate and a first transistor, and the first transistor is a P-type transistor; a first input terminal of the first NOR gate receives the stage-transfer signal outputted from the transferring circuit, an output terminal of the first NOR gate is connected with a gate electrode of the first transistor; a source electrode of the first transistor is connected with the first clock signal, and a drain electrode of the first transistor is connected with a second input terminal of the first NOR gate, and when the first transistor is turned on, the drain electrode of the first transistor outputs the Nth stage-transfer signal which is the same as the first clock signal.

Wherein, the latch circuit further includes a second transistor and a first NOT gate, and the second transistor is a P-type transistor; a source electrode of the second transistor is connected with the second clock signal, a gate electrode of the second transistor is connected with the output terminal of the first NOR gate, and a drain electrode of the second transistor is forwardly connected with the drain electrode of the first transistor through the first NOT gate; wherein the second clock signal is opposite to the first clock signal.

Wherein, the transferring circuit includes a first transferring gate and a second transferring gate; an input terminal of the first transferring gate is connected to the (N−1)th stage-transfer signal for turning on under the forward scanning, and outputting the (N−1)th stage-transfer signal to the latch circuit; and an input terminal of the second transferring gate is connected to the (N+1)th stage-transfer signal for turning on under the backward scanning, and outputting the (N+1)th stage-transfer signal to the latch circuit.

Wherein, the output circuit includes a second NOR gate, a second NOT gate, a third NOT gate and a fourth NOT gate connected sequentially; a first input terminal of the second NOR gate receives the Nth stage-transfer signal outputted from the latch circuit, and a second input terminal of the second NOR gate receives a reset signal; when at least one of the Nth stage-transfer signal and the reset signal is at a high voltage level, the output terminal of the second NOR gate is a low voltage level signal, and after passing through the second NOT gate, the third NOT gate and the fourth NOT gate, outputting the Nth stage scanning signal having a high voltage level.

Wherein, the output circuit is connected with the transferring circuit for receiving the (N−1)th stage-transfer signal, and outputting the Nth stage scanning signal which is the same as the (N−1)th stage-transfer signal in the forward scanning; or, in the backward scanning, the output circuit receives the (N+1)th stage-transfer signal, and outputs the Nth stage scanning signal which is the same as the (N+1)th stage-transfer signal.

Wherein, the latch circuit of the present embodiment includes a third NOR gate, a third transferring gate, a fourth transferring gate, a fifth NOT gate and a sixth NOT gate; a first input terminal of the third NOR gate receives the stage-transfer signal outputted from the transferring circuit, an output terminal of the third NOR gate is connected with a control terminal of each of the third transferring gate and the fourth transferring gate, the output terminal of the third NOR gate is also connected with another terminal of each of the third transferring gate and the fourth transferring gate through the fifth NOT gate; an input terminal of the third transferring gate is connected with the first clock signal, and the output terminal of the third transferring gate is connected with a second input terminal of the third NOR gate; and an input terminal of the fourth transferring gate is connected with the second clock signal, and an output terminal of the fourth transferring gate is forwardly connected with the second input terminal of the third NOR gate through the sixth NOT gate.

Wherein, the latch circuit includes a fourth NOR gate, a seventh NOT gate, a first NAND gate and an eighth NOT gate; a first input terminal of the fourth NOR gate receives the stage-transfer signal outputted from the transferring circuit, an output terminal of the fourth NOR gate is connected with a first input terminal of the first NAND gate through the seventh NOT gate; a second input terminal of the first NAND gate is connected with the first clock signal, and an output terminal of the first NAND gate is connected with a second input terminal of the fourth NOR gate through the eighth NOT gate; and an output terminal of the eighth NOT gate is connected with the output circuit in order to send the Nth stage-transferring signal to the output circuit.

Wherein, adjacent two GOA units include a transferring circuit, a latch circuit and an output circuit; the transferring circuit is used for receiving a (N−2)th stage-transfer signal of a (N−2)th stage GOA unit, and sending the (N−2)th stage-transfer signal to the latch circuit in the forward scanning; or, in the backward scanning, the transferring circuit receives a (N+3)th stage-transfer signal of a (N+3)th stage GOA unit, and sends the (N+3)th stage-transfer signal to the latch circuit; the latch circuit includes a fifth NOR gate, a second NAND gate, a third NAND gate, a ninth NOT gate, a tenth NOT gate, an eleventh NOT gate, a twelfth NOT gate, a fourth transistor and a fifth transistor; a first input terminal of the fifth NOR gate receives the stage-transfer signal outputted from the transferring circuit, an output terminal of the fifth NOR gate is connected with a first input terminal of the second NAND gate and a first input terminal of the third NAND gate respectively through the ninth NOT gate and the eleventh NOT gate, an output terminal of the second NAND gate is connected with the output circuit through the tenth NOT gate, an output terminal of the third NAND gate is connected with the output circuit through the twelfth NOT gate, a second input terminal of the second NAND gate is connected with a third clock signal, and a second input terminal of the third NAND gate is connected with a fourth clock signal; drain electrodes of the fourth transistor and the fifth transistor are respectively connected with output terminals of the tenth NOT gate and the twelfth NOT gate, source electrodes of the fourth transistor and the fifth transistor are connected with a second input terminal of the fifth NOR gate, gate electrodes of the fourth transistor and the fifth transistor are respectively connected with the fourth clock signal and the third clock signal; and the output circuit is connected with output terminals of the tenth NOT gate and the twelfth NOT gate in order to respectively output the Nth stage scanning signal and a (N+1)th stage scanning signal.

In order to solve the above technology problem, another technology solution adopted by the present invention is: a liquid crystal display device, wherein, the liquid crystal display device includes a gate-on-array (GOA) circuit, comprising: multiple cascaded GOA units, and each GOA unit includes a transferring circuit, a latch circuit and an output circuit connected sequentially; wherein, setting N as a positive integer, and in a Nth stage GOA unit: in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit; in a scanning period, the latch circuit receives a first clock signal and a second clock signal simultaneously, and outputs a Nth stage-transfer signal which is the same as a voltage level of the first clock signal and opposite to a voltage level of the second clock signal; and the output circuit is used for receiving the Nth stage-transfer signal, and outputs a Nth scanning signal which is the same as a voltage level of the Nth stage-transfer signal.

Wherein, the latch circuit includes a first NOR gate and a first transistor, and the first transistor is a P-type transistor; a first input terminal of the first NOR gate receives the stage-transfer signal outputted from the transferring circuit, an output terminal of the first NOR gate is connected with a gate electrode of the first transistor; a source electrode of the first transistor is connected with the first clock signal, and a drain electrode of the first transistor is connected with a second input terminal of the first NOR gate, and when the first transistor is turned on, the drain electrode of the first transistor outputs the Nth stage-transfer signal which is the same as the first clock signal.

Wherein, the latch circuit further includes a second transistor and a first NOT gate, and the second transistor is a P-type transistor; a source electrode of the second transistor is connected with the second clock signal, a gate electrode of the second transistor is connected with the output terminal of the first NOR gate, and a drain electrode of the second transistor is forwardly connected with the drain electrode of the first transistor through the first NOT gate; wherein the second clock signal is opposite to the first clock signal.

Wherein, the transferring circuit includes a first transferring gate and a second transferring gate; an input terminal of the first transferring gate is connected to the (N−1)th stage-transfer signal for turning on under the forward scanning, and outputting the (N−1)th stage-transfer signal to the latch circuit; and an input terminal of the second transferring gate is connected to the (N+1)th stage-transfer signal for turning on under the backward scanning, and outputting the (N+1)th stage-transfer signal to the latch circuit.

Wherein, the output circuit includes a second NOR gate, a second NOT gate, a third NOT gate and a fourth NOT gate connected sequentially; a first input terminal of the second NOR gate receives the Nth stage-transfer signal outputted from the latch circuit, and a second input terminal of the second NOR gate receives a reset signal; when at least one of the Nth stage-transfer signal and the reset signal is at a high voltage level, the output terminal of the second NOR gate is a low voltage level signal, and after passing through the second NOT gate, the third NOT gate and the fourth NOT gate, outputting the Nth stage scanning signal having a high voltage level.

Wherein, the output circuit is connected with the transferring circuit for receiving the (N−1)th stage-transfer signal, and outputting the Nth stage scanning signal which is the same as the (N−1)th stage-transfer signal in the forward scanning; or, in the backward scanning, the output circuit receives the (N+1)th stage-transfer signal, and outputs the Nth stage scanning signal which is the same as the (N+1)th stage-transfer signal.

Wherein, the latch circuit of the present embodiment includes a third NOR gate, a third transferring gate, a fourth transferring gate, a fifth NOT gate and a sixth NOT gate; a first input terminal of the third NOR gate receives the stage-transfer signal outputted from the transferring circuit, an output terminal of the third NOR gate is connected with a control terminal of each of the third transferring gate and the fourth transferring gate, the output terminal of the third NOR gate is also connected with another terminal of each of the third transferring gate and the fourth transferring gate through the fifth NOT gate; an input terminal of the third transferring gate is connected with the first clock signal, and the output terminal of the third transferring gate is connected with a second input terminal of the third NOR gate; and an input terminal of the fourth transferring gate is connected with the second clock signal, and an output terminal of the fourth transferring gate is forwardly connected with the second input terminal of the third NOR gate through the sixth NOT gate.

Wherein, the latch circuit includes a fourth NOR gate, a seventh NOT gate, a first NAND gate and an eighth NOT gate; a first input terminal of the fourth NOR gate receives the stage-transfer signal outputted from the transferring circuit, an output terminal of the fourth NOR gate is connected with a first input terminal of the first NAND gate through the seventh NOT gate; a second input terminal of the first NAND gate is connected with the first clock signal, and an output terminal of the first NAND gate is connected with a second input terminal of the fourth NOR gate through the eighth NOT gate; and an output terminal of the eighth NOT gate is connected with the output circuit in order to send the Nth stage-transferring signal to the output circuit.

Wherein, adjacent two GOA units include a transferring circuit, a latch circuit and an output circuit; the transferring circuit is used for receiving a (N−2)th stage-transfer signal of a (N−2)th stage GOA unit, and sending the (N−2)th stage-transfer signal to the latch circuit in the forward scanning; or, in the backward scanning, the transferring circuit receives a (N+3)th stage-transfer signal of a (N+3)th stage GOA unit, and sends the (N+3)th stage-transfer signal to the latch circuit; the latch circuit includes a fifth NOR gate, a second NAND gate, a third NAND gate, a ninth NOT gate, a tenth NOT gate, an eleventh NOT gate, a twelfth NOT gate, a fourth transistor and a fifth transistor; a first input terminal of the fifth NOR gate receives the stage-transfer signal outputted from the transferring circuit, an output terminal of the fifth NOR gate is connected with a first input terminal of the second NAND gate and a first input terminal of the third NAND gate respectively through the ninth NOT gate and the eleventh NOT gate, an output terminal of the second NAND gate is connected with the output circuit through the tenth NOT gate, an output terminal of the third NAND gate is connected with the output circuit through the twelfth NOT gate, a second input terminal of the second NAND gate is connected with a third clock signal, and a second input terminal of the third NAND gate is connected with a fourth clock signal; drain electrodes of the fourth transistor and the fifth transistor are respectively connected with output terminals of the tenth NOT gate and the twelfth NOT gate, source electrodes of the fourth transistor and the fifth transistor are connected with a second input terminal of the fifth NOR gate, gate electrodes of the fourth transistor and the fifth transistor are respectively connected with the fourth clock signal and the third clock signal; and the output circuit is connected with output terminals of the tenth NOT gate and the twelfth NOT gate in order to respectively output the Nth stage scanning signal and a (N+1)th stage scanning signal.

The beneficial effect of the present invention is: comparing with the conventional art, the present invention provides a gate-on-array (GOA) circuit, comprising: multiple cascaded GOA units, and each GOA unit includes a transferring circuit, a latch circuit and an output circuit connected sequentially; in a Nth stage GOA unit: in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit; in a scanning period, the latch circuit receives a first clock signal and a second clock signal simultaneously, and outputs a Nth stage-transfer signal which is the same as a voltage level of the first clock signal and opposite to a voltage level of the second clock signal; and the output circuit is used for receiving the Nth stage-transfer signal, and outputs a Nth scanning signal which is the same as a voltage level of the Nth stage-transfer signal. Through above way, the present embodiment utilizes two clock signals to simultaneously perform a driving in order to prevent a failure when changing the voltage level of the clock signal so as to improve a stability of the circuit.

DETAILED DESCRIPTION OF THE PREFERRED EMBODIMENT

Figure 1:
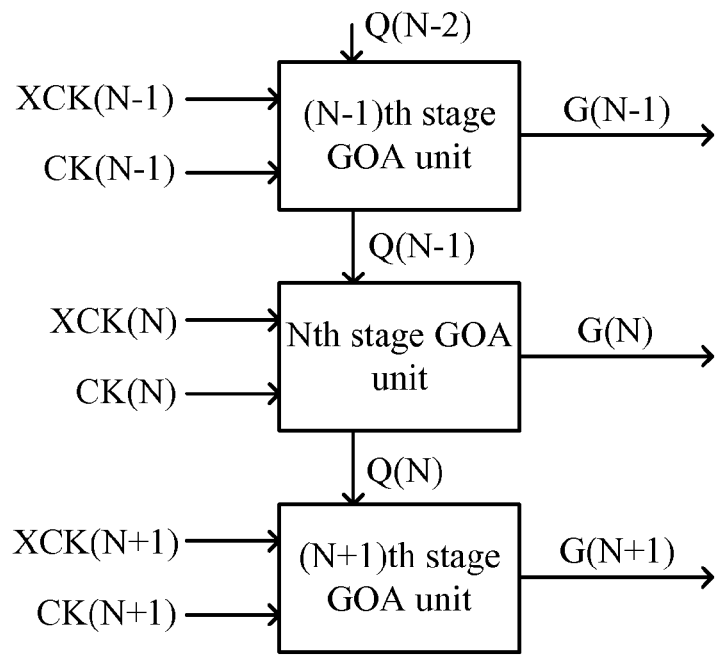
FIG. 1 is a schematic circuit diagram of a GOA circuit according to an embodiment of the present invention.

With reference to FIG. 1 is a schematic circuit diagram of a GOA circuit according to an embodiment of the present invention. The GOA circuit includes multiple cascaded GOA units. Wherein, in a forward scanning period, a first stage GOA unit receives a STV stage-transfer signal. Each GOA unit behind the first stage GOA unit receives a stage-transfer signal outputted from a previous stage GOA unit. For example, an Nth stage GOA unit receives a (N−1)th stage-transfer signal Q(N−1) outputted from a (N−1)th stage GOA unit. Or, in a backward scanning period, a last stage GOA unit receives a STV stage-transfer signal, and each stage GOA unit before the last stage GOA unit receives a stage-transfer signal outputted from a next stage GOA unit. For example, an Nth stage GOA unit receives a (N+1)th stage-transfer signal Q(N+1) outputted from a (N+1)th GOA unit.

Figure 2:
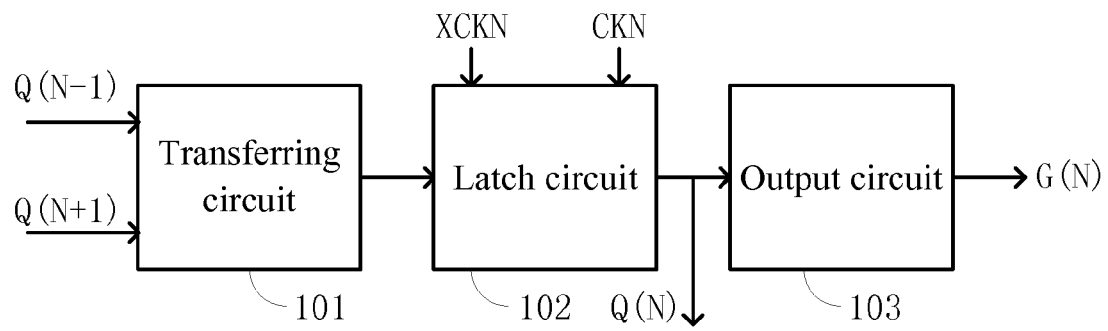
FIG. 2 is a schematic circuit diagram of an Nth stage GOA unit of the GOA circuit according to an embodiment of the present invention.

With also reference to FIG. 2, and FIG. 2 is a schematic circuit diagram of an Nth stage GOA unit of the GOA circuit according to an embodiment of the present invention. Each GOA unit includes a transferring circuit 101, a latch circuit 102 and an output circuit 103.

Setting N as a positive integer, in an Nth stage GOA unit:

In a forward scanning, the transferring circuit 101 receives a (N−1)th stage-transfer signal Q(N−1) of a (N−1)th stage GOA unit, and sending the (N−1)th stage-transfer signal Q(N−1) to the latch circuit 102. Or, in a backward scanning, the transferring circuit 101 receives a (N+1)th stage-transfer signal Q(N+1) of a (N+1)th stage GOA unit, and sending the (N+1)th stage-transfer signal Q(N+1) to the latch circuit 102.

The latch circuit 102 start operating according to the stage-transfer signal outputted from the transferring circuit 101. That is, when the (N−1)th stage-transfer signal Q(N−1) outputted from the transferring circuit 101 and received by the latch circuit 102 is at a high voltage level, the latch circuit 102 turns on a channel for receiving a clock signal, that is, start scanning. In a scanning period, the latch circuit 102 receives a first clock signal XCK(N) and a second clock signal CK(N) simultaneously, and outputs a Nth stage-transfer signal Q(N) which is the same as a voltage level of the first clock signal XCK(N) and opposite to a voltage level of the second clock signal CK(N).

The output circuit 103 is used for receiving the Nth stage-transfer signal Q(N), and outputs an Nth scanning signal G(N) which is the same as a voltage level of the Nth stage-transfer signal Q(N).

Comparing to the prior art, the present embodiment provides a GOA circuit, and the GOA circuit includes multiple cascaded GOA units. Each GOA unit includes a transferring circuit, a latch circuit and an output circuit. In a Nth stage GOA unit, when the transferring circuit is under a forward scanning, the transferring circuit receives a (N−1)th stage-transfer signal Q(N−1) of a (N−1)th stage GOA unit, and sending the stage-transfer signal Q(N−1) to the latch circuit; when the transferring circuit is under a backward scanning, the transferring circuit receives a (N+1)th stage-transfer signal Q(N+1) of a (N+1)th stage GOA unit, and sending the stage-transfer signal Q(N+1) to the latch circuit. In the scanning period, the latch circuit receives a first clock signal XCK(N) and a second clock signal CK(N) simultaneously, and outputs a Nth stage-transfer signal Q(N) which is the same as a voltage level of the first clock signal XCK(N) and opposite to a voltage level of the second clock signal CK(N). The output circuit is used for receiving the Nth stage-transfer signal Q(N), and outputs an Nth scanning signal G(N) which is the same as a voltage level of the Nth stage-transfer signal Q(N). Through above way, the present embodiment utilizes two clock signals to simultaneously perform a driving in order to prevent a failure when changing the voltage level of the clock signal so as to improve a stability of the circuit.

Figure 3:
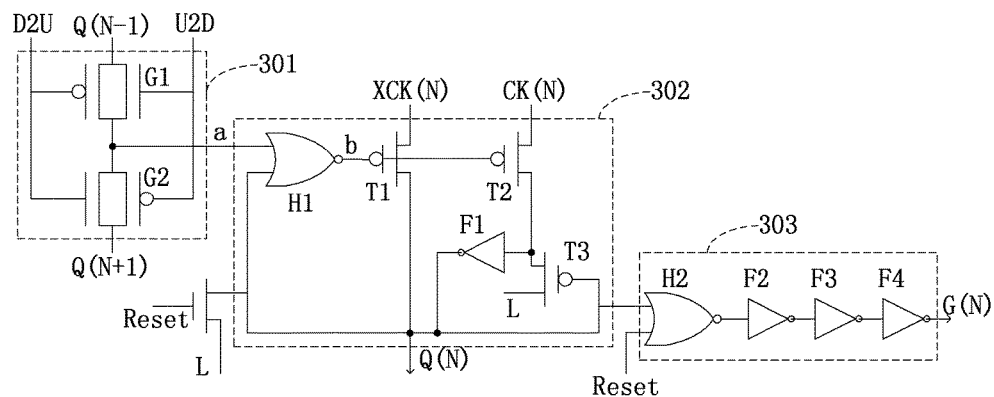
FIG. 3 is a schematic circuit diagram of an Nth stage GOA unit of the GOA circuit according to a first embodiment of the present invention.

With reference to FIG. 3, and FIG. 3 is a schematic circuit diagram of an Nth stage GOA unit of the GOA circuit according to a first embodiment of the present invention.

Wherein, the transferring circuit 301 includes a first transferring gate G1 and a second transferring gate G2. An input terminal of the first transferring gate G1 is connected to the (N−1)th stage-transfer signal Q(N−1) for turning on under the forward scanning, and outputting the (N−1)th stage-transfer signal Q(N−1) to the latch circuit 302. An input terminal of the second transferring gate G2 is connected to the (N+1)th stage-transfer signal Q(N+1) for turning on under the backward scanning, and outputting the (N+1)th stage-transfer signal Q(N+1) to the latch circuit 302.

Wherein, the latch circuit 302 includes a first NOR gate H1 and a first transistor T1. The first transistor T1 is a P-type transistor. A first input terminal of the first NOR gate H1 receives the stage-transfer signal outputted from the transferring circuit 301. An output terminal of the first NOR gate H1 is connected with a gate electrode of the first transistor T1. A source electrode of the first transistor T1 is connected with the first clock signal XCK(N), and a drain electrode of the first transistor T1 is connected with a second neither input terminal of the first NOR gate H1.

Wherein, the latch circuit 302 further includes a second transistor T2 and a first NOT gate F1. The second transistor T2 is a P-type transistor. A source electrode of the second transistor T2 is connected with the second clock signal CK(N), a gate electrode of the second transistor T2 is connected with the output terminal of the first NOR gate H1, and a drain electrode of the second transistor T2 is forwardly connected with the drain electrode of the first transistor T1 through the first NOT gate F1.

Besides, the latch circuit 302 further includes a third transistor T3, and the third transistor T3 is an N-type transistor. A gate electrode of the third transistor T3 is connected with the output terminal of the first NOT gate F1, a drain electrode of the third transistor T3 is connected with the input terminal of the first NOT gate F1, and the drain electrode of the third transistor T3 is connected with a low voltage-level signal for stabilizing a voltage at the output terminal of the first NOT gate F1.

Wherein, the output circuit 303 includes a second NOR gate H2, a second NOT gate F2, a third NOT gate F3 and a fourth NOT gate F4 connected sequentially. A first input terminal of the second NOR gate H2 receives the Nth stage-transfer signal Q(N) outputted from the latch circuit, and a second input terminal of the second NOR gate H2 receives a reset signal Reset.

Specifically, the second NOT gate F2 is used to reverse a phase of an output signal, and the third NOT gate F3 and the fourth NOT gate F4 have a buffering function.

Figure 4:
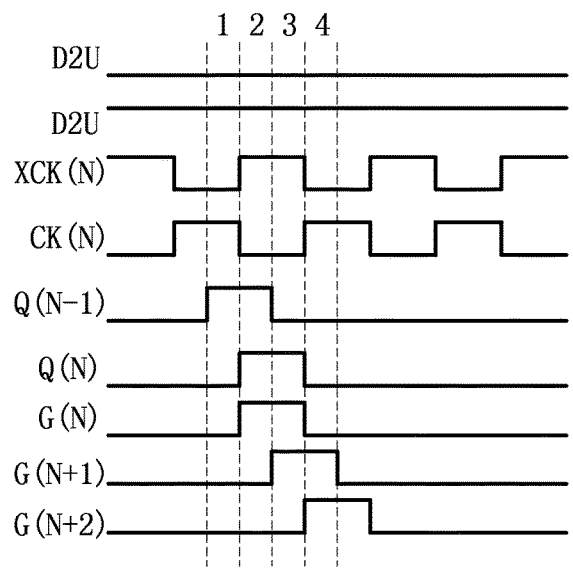
FIG. 4 is a timing diagram of an Nth stage GOA unit of the GOA circuit according to a first embodiment of the present invention.

Combining with the above circuit and with reference to FIG. 4, which is a timing diagram of an Nth GOA unit of the GOA circuit according to a first embodiment of the present invention for describing the present embodiment in detail.

Specifically, the following example is a timing of each node in an Nth stage GOA unit in the forward scanning Wherein, in the forward scanning period, a D2U signal in each GOA unit is at a low voltage level and a U2D signal in each GOA unit is at a high voltage level such that the first transferring gate G1 is always turned on in order to receive a stage-transfer signal of a previous stage GOA unit.

In a first operation period, Q(N−1) is at a high voltage level, XCK(N) is at a low voltage level, and CK(N) is at a high voltage level. Because Q(N−1) is at a high voltage level, node a is at a high voltage level. That is, the first input terminal of the first NOR gate H1 receives a high voltage level such that the first NOR gate H1 outputs a low voltage level, that is, node b is at a low voltage level. Accordingly, the first transistor T1 and the second transistor T2 are both turned on. Because the first clock signal XCK(N) is at a low voltage level, Q(N) is at a low voltage level.

Because the second clock signal CK(N) is at a high voltage level, and the second transistor T2 is turned on, the input terminal of the first NOT gate F1 generates a high voltage level so as to output a low voltage level. The gate electrode of the third transistor T3 is at a low voltage level such that the third transistor T3 is turned off. The output terminal of the second NOR gate H2 is a high voltage level signal, and after passing through the second NOT gate F2, the third NOT gate F3 and the fourth NOT gate F4, outputting a Nth stage scanning signal G(N) having a low voltage level.

In a second operation period, Q(N−1) is at a high voltage level, XCK(N) is at a high voltage level, and CK(N) is at a low voltage level. Because Q(N−1) is at a high voltage level, node a is at a high voltage level. That is, the first input terminal of the first NOR gate H1 receives a high voltage level such that the first NOR gate H1 output a low voltage level, that is, node b is at a low voltage level. Accordingly, the first transistor T1 and the second transistor T2 are both turned on. Because the first clock signal XCK(N) is at a high voltage level, Q(N) is at a high voltage level. Because Q(N) is at the high voltage, the third transistor T3 is turned on such that the input terminal of the first NOT gate F1 receives a low voltage level, and the first NOT gate F1 outputs a high voltage level signal in order to ensure that the high voltage level of the Q(N) is stable. The output terminal of the second NOR gate H2 is a low voltage level signal, and after passing through the second NOT gate F2, the third NOT gate F3 and the fourth NOT gate F4, outputting a Nth stage scanning signal G(N) having a high voltage level.

In a third operation period, Q(N−1) is at a low voltage level, XCK(N) is at a high voltage level, CK(N) is at a low voltage level. Because Q(N−1) is at a low voltage level, node a is at a low voltage level. But because Q(N) is a high voltage level, that is, the second input terminal of the first NOR gate H1 receives a high voltage level such that the first NOR gate H1 output a low voltage level, and node b is maintained at a low voltage level. Accordingly, the first transistor T1 and the second transistor T2 are continuously turned on. Because the first clock signal XCK(N) is at a high voltage level, Q(N) is at a high voltage level. Because Q(N) is at the high voltage, the third transistor T3 is turned on such that the input terminal of the first NOT gate F1 receives a low voltage level, and the first NOT gate F1 outputs a high voltage level signal in order to ensure that the high voltage level of the Q(N) is stable. The output terminal of the second NOR gate H2 is a low voltage level signal, and after passing through the second NOT gate F2, the third NOT gate F3 and the fourth NOT gate F4, outputting the Nth stage scanning signal G(N) having a high voltage level.

In a fourth operation period, Q(N−1) is at a high voltage level, XCK(N) is at a low voltage level, CK(N) is at a high voltage level. Because XCK(N) is at a low voltage level such that Q(N) instantaneously become a low voltage level, and because Q(N) is a low voltage level at the same time, node a is at a low voltage level. That is, the first input terminal and the second input terminal of the first NOR gate H1 both receive low voltage levels such that the first NOR gate H1 outputs a high voltage level. That is node b is at a high voltage level so that the first transistor and the second transistor T2 are both turned off. The gate electrode of the third transistor T3 is at a low voltage level, and the third transistor T3 is turned off. The output terminal of the second NOR gate H2 is a high voltage level signal, and after passing through the second NOT gate F2, the third NOT gate F3 and the fourth NOT gate F4, outputting a Nth stage scanning signal G(N) having a low voltage level.

It should be noted that using the forward scanning as an example, during the scanning period, the first clock signal and the second clock signal of each stage are different. In a normal condition, the clock signals of each stage will delay a half period with respect to the clock signals of a corresponding previous stage, that is, two operation periods in FIG. 4. Besides, in the present embodiment, the clock signals of each stage can delay one-quarter period with respect to the clock signals of the corresponding previous stage. That is, high voltage levels of clock signals corresponding to two adjacent stages are overlapped with each other. For example, the first clock signal XCK(N) of the Nth stage GOA unit is delayed by one-quarter period with respect to the first clock signal XCK(N−1) of the (N−1)th stage GOA unit. The second clock signal CK(N) of the Nth stage GOA unit is delayed by one-quarter period with respect to the second clock signal CK(N−1) of the (N−1)th stage GOA unit. Through above way, as shown in FIG. 4, the scanning signals of two adjacent stages also correspondingly delayed one-quarter period, that is, the high voltage levels are overlapped.

Comparing with the conventional art, the embodiment of the present invention discloses a specific circuit of a GOA unit. Through a common driving by the first clock signal XCK(N) and the second clock signal CK(N), the stability of the circuit is increased. At the same time, clock signals corresponding to two adjacent stages utilize an overlapped timing arrangement, the failure risk in transition of the voltage level of the latch circuit can be decreased. Besides, because the NOR gates are used to realize the logic function, the power consumption of the circuit can be decreased to reduce the leakage.

Figure 5:
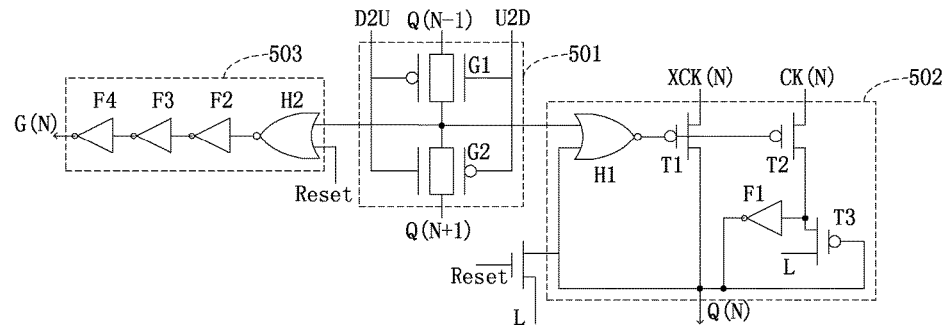
FIG. 5 is a schematic circuit diagram of an Nth stage GOA unit of the GOA circuit according to a second embodiment of the present invention.

With reference to FIG. 5, and FIG. 5 is a schematic circuit diagram of an Nth stage GOA unit of the GOA circuit according to a second embodiment of the present invention. The circuit includes a transferring circuit 501, a latch circuit 502 and an output circuit 503.

Wherein, the output circuit 503 is connected with the transferring circuit 501 for receiving the (N−1)th stage-transfer signal Q(N−1), and outputting the Nth stage scanning signal G(N) which is the same as the (N−1)th stage-transfer signal Q(N−1) in the forward scanning. Or, in the backward scanning, the output circuit 503 receives the (N+1)th stage-transfer signal Q(N+1), and outputs the Nth stage scanning signal G(N) which is the same as the (N+1)th stage-transfer signal Q(N+1).

Specifically, the transferring circuit 501, the latch circuit 502 and the output circuit 503 of the present embodiment are the same as the GOA circuit of the second embodiment of the present invention. The difference is that the output circuit 503 no longer receives the Q(N) signal outputted from the latch circuit 502, but receiving the Q(N−1) signal outputted from the transferring circuit 501. Besides, the latch circuit 502 only provides a stage-transfer signal. Accordingly, the stability of the circuit is increased.

The embodiment method is similar to the above embodiment, no more repeating.

Figure 6:
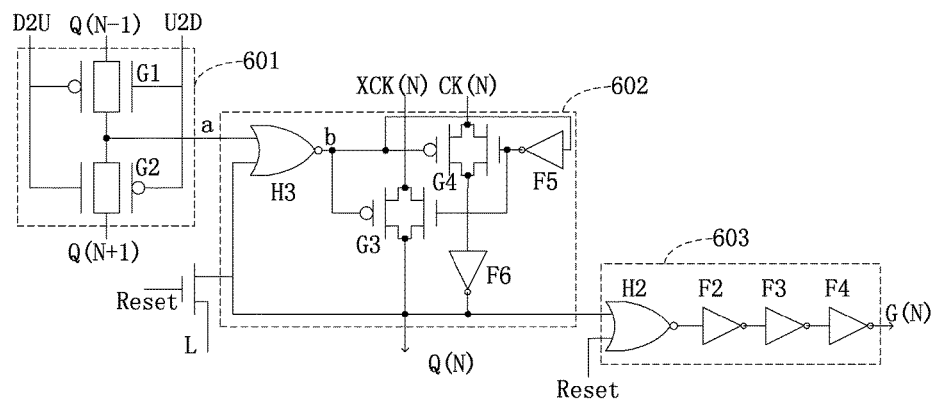
FIG. 6 is a schematic circuit diagram of an Nth stage GOA unit of the GOA circuit according to a third embodiment of the present invention.

With reference to FIG. 6, and FIG. 6 is a schematic circuit diagram of a Nth stage GOA unit of the GOA circuit according to a third embodiment of the present invention. The circuit includes a transferring circuit 601, a latch circuit 602 and an output circuit 603.

Wherein, the transferring circuit 601 and the output circuit 603 are the same as corresponding circuits of above embodiments. The difference is that the latch circuit 602 of the present embodiment does not include a third NOR gate H3, a third transferring gate G3, a fourth transferring gate G4, a fifth NOT gate F5 and a sixth NOT gate F6.

Wherein, a first input terminal of the third NOR gate H3 receives the stage-transfer signal outputted from the transferring circuit. An output terminal of the third NOR gate H3 is connected with a control terminal of each of the third transferring gate G3 and the fourth transferring gate G4. The output terminal of the third NOR gate H3 is also connected with another terminal of each of the third transferring gate G3 and the fourth transferring gate G4 through the fifth NOT gate F5. An input terminal of the third transferring gate G3 is connected with the first clock signal XCK(N), and the output terminal of the third transferring gate G3 is connected with a second input terminal of the third NOR gate H3. An input terminal of the fourth transferring gate G4 is connected with the second clock signal CK(N), and an output terminal of the fourth transferring gate G4 is forwardly connected with the second input terminal of the third NOR gate H3 through the sixth NOT gate F6.

Comparing with the above embodiments, the latch circuit of the present embodiment includes a NOR gate and a transferring gate so as to stabilize the voltage level of the node Q(N).

Figure 7:
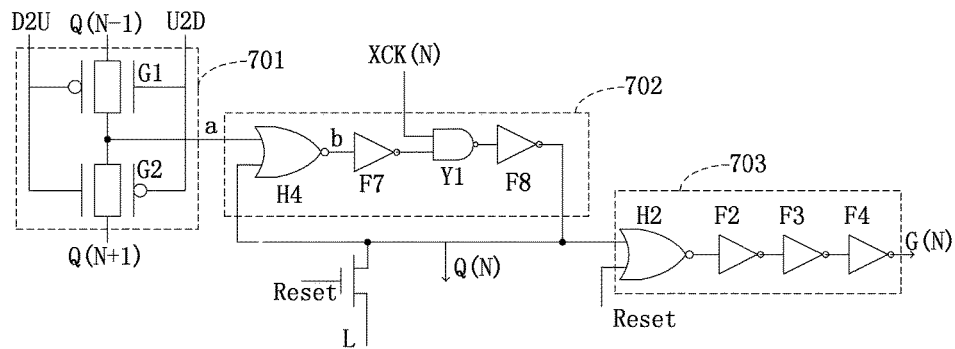
FIG. 7 is a schematic circuit diagram of an Nth stage GOA unit of the GOA circuit according to a fourth embodiment of the present invention.

With reference to FIG. 7, and FIG. 7 is a schematic circuit diagram of a Nth stage GOA unit of the GOA circuit according to a fourth embodiment of the present invention. The circuit includes a transferring circuit 701, a latch circuit 702 and an output circuit 703.

Wherein, the transferring circuit 701 and the output circuit 703 are the same as corresponding circuits of above embodiments. The difference is that the latch circuit 702 of the present embodiment includes a fourth NOR gate H4, a seventh NOT gate F7, a first NAND gate Y1 and an eighth NOT gate F8.

A first input terminal of the fourth NOR gate H4 receives the stage-transfer signal outputted from the transferring circuit 701. An output terminal of the fourth NOR gate H4 is connected with a first input terminal of the first NAND gate Y1 through the seventh NOT gate F7. A second input terminal of the first NAND gate Y1 is connected with the first clock signal XCK(N), and an output terminal of the first NAND gate Y1 is connected with a second input terminal of the fourth NOR gate H4 through the eighth NOT gate F8. An output terminal of the eighth NOT gate F8 is connected with the output circuit in order to send the Nth stage-transferring signal Q(N) to the output circuit.

Comparing with the above embodiments, the latch circuit of the present embodiment includes a NOR gate and a NAND gate, which can decrease the power consumption of the circuit.

Besides, in the above embodiments, at the nodes where the Q(N) is located, reset circuits as shown in FIG. 3, FIG. 5, FIG. 6 and FIG. 7 can be added for resetting the circuit before scanning or after scanning.

Figure 8:
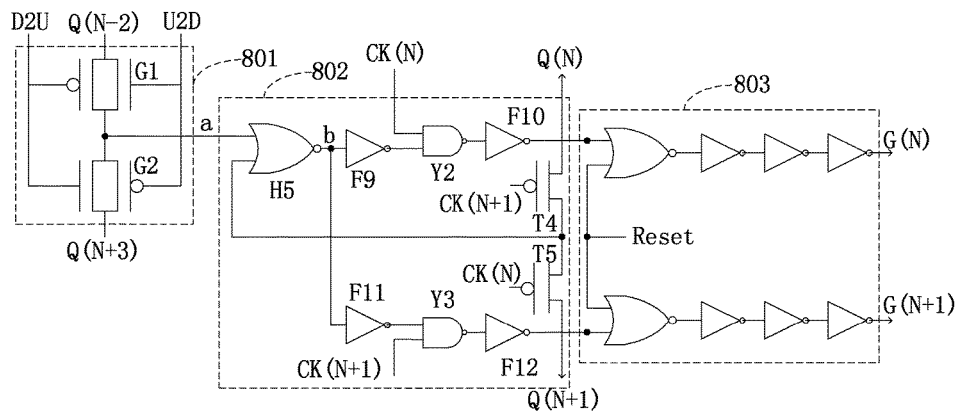
FIG. 8 is a schematic circuit diagram of a Nth stage GOA unit of the GOA circuit according to a fifth embodiment of the present invention.

With reference to FIG. 8, and FIG. 8 is a schematic circuit diagram of a Nth stage GOA unit of the GOA circuit according to a fifth embodiment of the present invention. Wherein, adjacent two GOA units include a transferring circuit 801, a latch circuit 802 and an output circuit 803.

Specifically, the latch circuit 802 of the present embodiment combines two latch circuits 702 of the present invention to form the new latch circuit 802, and combines two output circuits 703 of the present invention to form the new output circuit 803.

Specifically, the transferring circuit 801 is used for receiving a (N−2)th stage-transfer signal Q(N−2) of a (N−2)th stage GOA unit, and sending the (N−2)th stage-transfer signal Q(N−2) to the latch circuit 802 in the forward scanning. Or, in the backward scanning, the transferring circuit 801 receives a (N+3)th stage-transfer signal Q(N+3) of a (N+3)th stage GOA unit, and sends the (N+3)th stage-transfer signal Q(N+3) to the latch circuit 802.

The latch circuit 802 includes a fifth NOR gate H5, a second NAND gate Y2, a third NAND gate Y3, a ninth NOT gate F9, a tenth NOT gate F10, an eleventh NOT gate F11, a twelfth NOT gate F12, a fourth transistor T4 and a fifth transistor T5. A first input terminal of the fifth NOR gate H5 receives the stage-transfer signal outputted from the transferring circuit 801. An output terminal of the fifth NOR gate H5 is connected with a first input terminal of the second NAND gate Y2 and a first input terminal of the third NAND gate Y3 respectively through the ninth NOT gate F9 and the eleventh NOT gate F11. An output terminal of the second NAND gate Y2 is connected with the output circuit 803 through the tenth NOT gate F10. An output terminal of the third NAND gate Y3 is connected with the output circuit 803 through the twelfth NOT gate F12. A second input terminal of the second NAND gate Y2 is connected with a third clock signal, and a second input terminal of the third NAND gate Y3 is connected with a fourth clock signal.

Drain electrodes of the fourth transistor T4 and the fifth transistor T5 are respectively connected with output terminals of the tenth NOT gate F10 and the twelfth NOT gate F12. Source electrodes of the fourth transistor T4 and the fifth transistor T5 are connected with a second input terminal of the fifth NOR gate H5. Gate electrodes of the fourth transistor T4 and the fifth transistor T5 are respectively connected with the fourth clock signal and the third clock signal. The output circuit is connected with output terminals of the tenth NOT gate F10 and the twelfth NOT gate F12 in order to respectively output the Nth stage scanning signal G(N) and a (N+1)th stage scanning signal G(N+1).

Specifically, the third clock signal and the fourth clock signal can be two signals that are overlapped in timing. Wherein, the fourth clock signal delay one-quarter period with respect to the third clock signal.

Comparing with the above embodiments, two GOA units are combined as one unit to share one transferring circuit in order to decrease the number of the electric elements and the power consumption.

Figure 9:
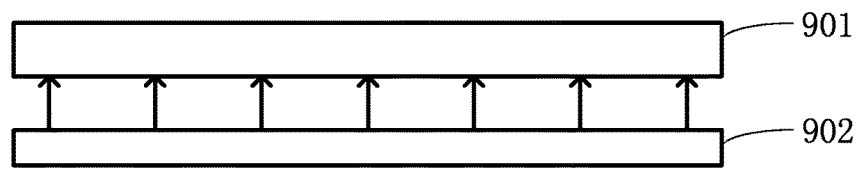
FIG. 9 is a schematic diagram of a liquid crystal display device according to an embodiment of the present invention.

With reference to FIG. 9, and FIG. 9 is a schematic diagram of a liquid crystal display device according to an embodiment of the present invention. The liquid crystal display device includes a display panel 901 and a backlight 902. The display panel includes a GOA unit, wherein, the GOA circuit is the GOA circuit described at each of above embodiments. The specific implementation method is similar, no more repeating.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A gate-on-array (GOA) circuit, comprising:
multiple cascaded GOA units, and each GOA unit includes a transferring circuit, a latch circuit and an output circuit connected sequentially;
wherein, setting N as a positive integer, and in an Nth stage GOA unit:
in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit;
in a scanning period, the latch circuit receives a first clock signal and a second clock signal simultaneously, and outputs a Nth stage-transfer signal which is the same as a voltage level of the first clock signal and opposite to a voltage level of the second clock signal; and
the output circuit is used for receiving the Nth stage-transfer signal, and outputs an Nth scanning signal which is the same as a voltage level of the Nth stage-transfer signal;
wherein, the transferring circuit includes a first transferring gate and a second transferring gate; an input terminal of the first transferring gate is connected to the (N−1)th stage-transfer signal for turning on under the forward scanning, and outputting the (N−1)th stage-transfer signal to the latch circuit; and an input terminal of the second transferring gate is connected to the (N+1)th stage-transfer signal for turning on under the backward scanning, and outputting the (N+1)th stage-transfer signal to the latch circuit; and
wherein, the output circuit includes a second NOR gate, a second NOT gate, a third NOT gate and a fourth NOT gate connected sequentially; a first input terminal of the second NOR gate receives the Nth stage-transfer signal outputted from the latch circuit, and a second input terminal of the second NOR gate receives a reset signal; when at least one of the Nth stage-transfer signal and the reset signal is at a high voltage level, the output terminal of the second NOR gate is a low voltage level signal, and after passing through the second NOT gate, the third NOT gate and the fourth NOT gate, outputting the Nth stage scanning signal having a high voltage level.

2. A gate-on-array (GOA) circuit, comprising:
multiple cascaded GOA units, and each GOA unit includes a transferring circuit, a latch circuit and an output circuit connected sequentially;
wherein, setting N as a positive integer, and in an Nth stage GOA unit:
in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit;
in a scanning period, the latch circuit receives a first clock signal and a second clock signal simultaneously, and outputs a Nth stage-transfer signal which is the same as a voltage level of the first clock signal and opposite to a voltage level of the second clock signal; and
the output circuit is used for receiving the Nth stage-transfer signal, and outputs an Nth scanning signal which is the same as a voltage level of the Nth stage-transfer signal.

3. The gate-on-array (GOA) circuit according to claim 2, wherein, the transferring circuit includes a first transferring gate and a second transferring gate;
an input terminal of the first transferring gate is connected to the (N−1)th stage-transfer signal for turning on under the forward scanning, and outputting the (N−1)th stage-transfer signal to the latch circuit; and
an input terminal of the second transferring gate is connected to the (N+1)th stage-transfer signal for turning on under the backward scanning, and outputting the (N+1)th stage-transfer signal to the latch circuit.

4. The gate-on-array (GOA) circuit according to claim 2, wherein, the output circuit includes a second NOR gate, a second NOT gate, a third NOT gate and a fourth NOT gate connected sequentially;
a first input terminal of the second NOR gate receives the Nth stage-transfer signal outputted from the latch circuit, and a second input terminal of the second NOR gate receives a reset signal; when at least one of the Nth stage-transfer signal and the reset signal is at a high voltage level, the output terminal of the second NOR gate is a low voltage level signal, and after passing through the second NOT gate, the third NOT gate and the fourth NOT gate, outputting the Nth stage scanning signal having a high voltage level.

5. The gate-on-array (GOA) circuit according to claim 2, wherein, the output circuit is connected with the transferring circuit for receiving the (N−1)th stage-transfer signal, and outputting the Nth stage scanning signal which is the same as the (N−1)th stage-transfer signal in the forward scanning; or, in the backward scanning, the output circuit receives the (N+1)th stage-transfer signal, and outputs the Nth stage scanning signal which is the same as the (N+1)th stage-transfer signal.

6. The gate-on-array (GOA) circuit according to claim 2, wherein, the latch circuit of the present embodiment includes a third NOR gate, a third transferring gate, a fourth transferring gate, a fifth NOT gate and a sixth NOT gate;
a first input terminal of the third NOR gate receives the stage-transfer signal outputted from the transferring circuit, an output terminal of the third NOR gate is connected with a control terminal of each of the third transferring gate and the fourth transferring gate, the output terminal of the third NOR gate is also connected with another terminal of each of the third transferring gate and the fourth transferring gate through the fifth NOT gate;
an input terminal of the third transferring gate is connected with the first clock signal, and the output terminal of the third transferring gate is connected with a second input terminal of the third NOR gate; and an input terminal of the fourth transferring gate is connected with the second clock signal, and an output terminal of the fourth transferring gate is forwardly connected with the second input terminal of the third NOR gate through the sixth NOT gate.

7. The gate-on-array (GOA) circuit according to claim 2, wherein, the latch circuit includes a fourth NOR gate, a seventh NOT gate, a first NAND gate and an eighth NOT gate;
   a first input terminal of the fourth NOR gate receives the stage-transfer signal outputted from the transferring circuit, an output terminal of the fourth NOR gate is connected with a first input terminal of the first NAND gate through the seventh NOT gate;
   a second input terminal of the first NAND gate is connected with the first clock signal, and an output terminal of the first NAND gate is connected with a second input terminal of the fourth NOR gate through the eighth NOT gate; and
   an output terminal of the eighth NOT gate is connected with the output circuit in order to send the Nth stage-transferring signal to the output circuit.

8. The gate-on-array (GOA) circuit according to claim 2, wherein, adjacent two GOA units include a transferring circuit, a latch circuit and an output circuit;
   the transferring circuit is used for receiving a (N−2)th stage-transfer signal of a (N−2)th stage GOA unit, and sending the (N−2)th stage-transfer signal to the latch circuit in the forward scanning; or, in the backward scanning, the transferring circuit receives a (N+3)th stage-transfer signal of a (N+3)th stage GOA unit, and sends the (N+3)th stage-transfer signal to the latch circuit;
   the latch circuit includes a fifth NOR gate, a second NAND gate, a third NAND gate, a ninth NOT gate, a tenth NOT gate, an eleventh NOT gate, a twelfth NOT gate, a fourth transistor and a fifth transistor;
   a first input terminal of the fifth NOR gate receives the stage-transfer signal outputted from the transferring circuit, an output terminal of the fifth NOR gate is connected with a first input terminal of the second NAND gate and a first input terminal of the third NAND gate respectively through the ninth NOT gate and the eleventh NOT gate, an output terminal of the second NAND gate is connected with the output circuit through the tenth NOT gate, an output terminal of the third NAND gate is connected with the output circuit through the twelfth NOT gate, a second input terminal of the second NAND gate is connected with a third clock signal, and a second input terminal of the third NAND gate is connected with a fourth clock signal;
   drain electrodes of the fourth transistor and the fifth transistor are respectively connected with output terminals of the tenth NOT gate and the twelfth NOT gate, source electrodes of the fourth transistor and the fifth transistor are connected with a second input terminal of the fifth NOR gate, gate electrodes of the fourth transistor and the fifth transistor are respectively connected with the fourth clock signal and the third clock signal; and
   the output circuit is connected with output terminals of the tenth NOT gate and the twelfth NOT gate in order to respectively output the Nth stage scanning signal and a (N+1)th stage scanning signal.

9. The gate-on-array (GOA) circuit according to claim 2, wherein, the latch circuit includes a first NOR gate and a first transistor, and the first transistor is a P-type transistor;
   a first input terminal of the first NOR gate receives the stage-transfer signal outputted from the transferring circuit, an output terminal of the first NOR gate is connected with a gate electrode of the first transistor;
   a source electrode of the first transistor is connected with the first clock signal, and a drain electrode of the first transistor is connected with a second input terminal of the first NOR gate, and when the first transistor is turned on, the drain electrode of the first transistor outputs the Nth stage-transfer signal which is the same as the first clock signal.

10. The gate-on-array (GOA) circuit according to claim 9, wherein, the latch circuit further includes a second transistor and a first NOT gate, and the second transistor is a P-type transistor;
    a source electrode of the second transistor is connected with the second clock signal, a gate electrode of the second transistor is connected with the output terminal of the first NOR gate, and a drain electrode of the second transistor is forwardly connected with the drain electrode of the first transistor through the first NOT gate; wherein the second clock signal is opposite to the first clock signal.

11. A liquid crystal display device, wherein, the liquid crystal display device includes a gate-on-array (GOA) circuit, comprising:
    multiple cascaded GOA units, and each GOA unit includes a transferring circuit, a latch circuit and an output circuit connected sequentially;
    wherein, setting N as a positive integer, and in an Nth stage GOA unit:
    in a forward scanning, the transferring circuit receives a (N−1)th stage-transfer signal of a (N−1)th stage GOA unit, and sending the (N−1)th stage-transfer signal to the latch circuit; or, in a backward scanning, the transferring circuit receives a (N+1)th stage-transfer signal of a (N+1)th stage GOA unit, and sending the (N+1)th stage-transfer signal to the latch circuit;
    in a scanning period, the latch circuit receives a first clock signal and a second clock signal simultaneously, and outputs a Nth stage-transfer signal which is the same as a voltage level of the first clock signal and opposite to a voltage level of the second clock signal; and
    the output circuit is used for receiving the Nth stage-transfer signal, and outputs an Nth scanning signal which is the same as a voltage level of the Nth stage-transfer signal.

12. The liquid crystal display device according to claim 11, wherein, the transferring circuit includes a first transferring gate and a second transferring gate;
    an input terminal of the first transferring gate is connected to the (N−1)th stage-transfer signal for turning on under the forward scanning, and outputting the (N−1)th stage-transfer signal to the latch circuit; and
    an input terminal of the second transferring gate is connected to the (N+1)th stage-transfer signal for turning on under the backward scanning, and outputting the (N+1)th stage-transfer signal to the latch circuit.

13. The liquid crystal display device according to claim 11, wherein, the output circuit includes a second NOR gate, a second NOT gate, a third NOT gate and a fourth NOT gate connected sequentially;
    a first input terminal of the second NOR gate receives the Nth stage-transfer signal outputted from the latch circuit, and a second input terminal of the second NOR gate receives a reset signal; when at least one of the Nth stage-transfer signal and the reset signal is at a high voltage level, the output terminal of the second NOR gate is a low voltage level signal, and after passing through the second NOT gate, the third NOT gate and the fourth NOT gate, outputting the Nth stage scanning signal having a high voltage level.

14. The liquid crystal display device according to claim 11, wherein, he output circuit is connected with the transferring circuit for receiving the (N−1)th stage-transfer signal, and outputting the Nth stage scanning signal which is the same as the (N−1)th stage-transfer signal in the forward scanning; or, in the backward scanning, the output circuit receives the (N+1)th stage-transfer signal, and outputs the Nth stage scanning signal which is the same as the (N+1)th stage-transfer signal.

15. The liquid crystal display device according to claim 11, wherein, the latch circuit of the present embodiment includes a third NOR gate, a third transferring gate, a fourth transferring gate, a fifth NOT gate and a sixth NOT gate;
a first input terminal of the third NOR gate receives the stage-transfer signal outputted from the transferring circuit, an output terminal of the third NOR gate is connected with a control terminal of each of the third transferring gate and the fourth transferring gate, the output terminal of the third NOR gate is also connected with another terminal of each of the third transferring gate and the fourth transferring gate through the fifth NOT gate;
an input terminal of the third transferring gate is connected with the first clock signal, and the output terminal of the third transferring gate is connected with a second input terminal of the third NOR gate; and
an input terminal of the fourth transferring gate is connected with the second clock signal, and an output terminal of the fourth transferring gate is forwardly connected with the second input terminal of the third NOR gate through the sixth NOT gate.

16. The liquid crystal display device according to claim 11, wherein, the latch circuit includes a fourth NOR gate, a seventh NOT gate, a first NAND gate and an eighth NOT gate;
a first input terminal of the fourth NOR gate receives the stage-transfer signal outputted from the transferring circuit, an output terminal of the fourth NOR gate is connected with a first input terminal of the first NAND gate through the seventh NOT gate;
a second input terminal of the first NAND gate is connected with the first clock signal, and an output terminal of the first NAND gate is connected with a second input terminal of the fourth NOR gate through the eighth NOT gate; and
an output terminal of the eighth NOT gate is connected with the output circuit in order to send the Nth stage-transferring signal to the output circuit.

17. The liquid crystal display device according to claim 11, wherein, adjacent two GOA units include a transferring circuit, a latch circuit and an output circuit;
the transferring circuit is used for receiving a (N−2)th stage-transfer signal of a (N−2)th stage GOA unit, and sending the (N−2)th stage-transfer signal to the latch circuit in the forward scanning; or, in the backward scanning, the transferring circuit receives a (N+3)th stage-transfer signal of a (N+3)th stage GOA unit, and sends the (N+3)th stage-transfer signal to the latch circuit;
the latch circuit includes a fifth NOR gate, a second NAND gate, a third NAND gate, a ninth NOT gate, a tenth NOT gate, an eleventh NOT gate, a twelfth NOT gate, a fourth transistor and a fifth transistor;
a first input terminal of the fifth NOR gate receives the stage-transfer signal outputted from the transferring circuit, an output terminal of the fifth NOR gate is connected with a first input terminal of the second NAND gate and a first input terminal of the third NAND gate respectively through the ninth NOT gate and the eleventh NOT gate, an output terminal of the second NAND gate is connected with the output circuit through the tenth NOT gate, an output terminal of the third NAND gate is connected with the output circuit through the twelfth NOT gate, a second input terminal of the second NAND gate is connected with a third clock signal, and a second input terminal of the third NAND gate is connected with a fourth clock signal;
drain electrodes of the fourth transistor and the fifth transistor are respectively connected with output terminals of the tenth NOT gate and the twelfth NOT gate, source electrodes of the fourth transistor and the fifth transistor are connected with a second input terminal of the fifth NOR gate, gate electrodes of the fourth transistor and the fifth transistor are respectively connected with the fourth clock signal and the third clock signal; and
the output circuit is connected with output terminals of the tenth NOT gate and the twelfth NOT gate in order to respectively output the Nth stage scanning signal and a (N+1)th stage scanning signal.

18. The liquid crystal display device according to claim 11, wherein, the latch circuit includes a first NOR gate and a first transistor, and the first transistor is a P-type transistor;
a first input terminal of the first NOR gate receives the stage-transfer signal outputted from the transferring circuit, an output terminal of the first NOR gate is connected with a gate electrode of the first transistor;
a source electrode of the first transistor is connected with the first clock signal, and a drain electrode of the first transistor is connected with a second input terminal of the first NOR gate, and when the first transistor is turned on, the drain electrode of the first transistor outputs the Nth stage-transfer signal which is the same as the first clock signal.

19. The liquid crystal display device according to claim 18, wherein, the latch circuit further includes a second transistor and a first NOT gate, and the second transistor is a P-type transistor;
a source electrode of the second transistor is connected with the second clock signal, a gate electrode of the second transistor is connected with the output terminal of the first NOR gate, and a drain electrode of the second transistor is forwardly connected with the drain electrode of the first transistor through the first NOT gate; wherein the second clock signal is opposite to the first clock signal.

* * * * *